US008314662B2

(12) United States Patent
Isohata et al.

(10) Patent No.: US 8,314,662 B2
(45) Date of Patent: Nov. 20, 2012

(54) TEMPERATURE COMPENSATION METHOD FOR PIEZOELECTRIC OSCILLATOR, AND PIEZOELECTRIC OSCILLATOR

(75) Inventors: Kensaku Isohata, Kamiina (JP); Masayuki Ishikawa, Suwa (JP)

(73) Assignee: Seiko Epson Corporation (JP)

( * ) Notice: Subject to any disclaimer, the term of this patent is extended or adjusted under 35 U.S.C. 154(b) by 31 days.

(21) Appl. No.: 12/947,049

(22) Filed: Nov. 16, 2010

(65) Prior Publication Data

US 2011/0121909 A1 May 26, 2011

(30) Foreign Application Priority Data

Nov. 24, 2009 (JP) ................................. 2009-266693

(51) Int. Cl.
*H03L 1/00* (2006.01)

(52) U.S. Cl. ............ 331/176; 331/44; 331/66; 331/154; 331/175

(58) Field of Classification Search .............. 331/116 R, 331/154, 158, 176, 44, 66, 175
See application file for complete search history.

(56) References Cited

U.S. PATENT DOCUMENTS

| 5,774,800 | A  | * | 6/1998  | Mori     | 455/255 |
| 6,545,550 | B1 | * | 4/2003  | Frerking | 331/44  |
| 2003/0197567 | A1 | * | 10/2003 | Villella        | 331/158 |
| 2006/0071728 | A1 |   | 4/2006  | Chen            |         |
| 2008/0150642 | A1 | * | 6/2008  | Partridge et al. | 331/66  |
| 2008/0164952 | A1 | * | 7/2008  | Babitch         | 331/66  |
| 2008/0297268 | A1 | * | 12/2008 | Matsui et al.   | 331/176 |

FOREIGN PATENT DOCUMENTS

JP 2003-324318 11/2003

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A temperature compensation method for a piezoelectric oscillator including a piezoelectric vibrator having a frequency temperature characteristic with a hysteresis characteristic, and an oscillation circuit which oscillates the piezoelectric vibrator and outputs an oscillation signal, wherein, to a temperature compensation circuit which can calculate a quantity of temperature compensation using frequency temperature information indicating a temperature characteristic of an oscillation frequency of the piezoelectric vibrator and temperature information of the piezoelectric vibrator at the time of oscillation of the oscillation signal, the oscillation signal and the frequency temperature information are outputted, includes: calculating, as the frequency temperature information, an intermediate value between elevated-temperature frequency temperature information of the piezoelectric vibrator that is generated in the case where ambient temperature of the piezoelectric vibrator is elevated, and lowered-temperature frequency temperature information of the piezoelectric vibrator that is generated in the case where the ambient temperature is lowered.

11 Claims, 7 Drawing Sheets

| | NUMBER OF DIGITS | EXAMPLE (IN CASE OF 5 POINTS) | | | | COMPARISON WITH ASBOLUTE VALUE |
|---|---|---|---|---|---|---|
| IN CASE OF ABSOLUTE VALUE (UP TO ppb DIGITS) | 11 DIGITS | 26.000123456MHz | 26.000223789MHz | 26.000223456MHz | 26.000023456MHz | 26.000123789MHz | |
| IN CASE OF FREQUENCY DEVIATION (UP TO ppb DIGITS) | 5 DIGITS | 20.123ppm | 45.123ppm | 2.123ppm | 45.789ppm | 20.123ppm | REDUCTION BY ABOUT 45% |

FIG. 7

TEMPERATURE COMPENSATION METHOD FOR PIEZOELECTRIC OSCILLATOR, AND PIEZOELECTRIC OSCILLATOR

The entire disclosure of Japanese Patent Application No. 2009-266693, filed Nov. 24, 2009 is expressly incorporated by reference herein.

BACKGROUND

1. Technical Field

The present invention relates to a temperature compensation for a piezoelectric oscillator which measures a position based on positioning signals from GPS (Global Positioning System) satellites, and particularly to temperature compensation for a piezoelectric oscillator that is installed in a TSXO (Temperature Sensor Xtal Oscillator) as a piezoelectric oscillator leaving a temperature compensation function to an external unit and provided by an external temperature compensation circuit.

2. Related Art

A receiving device such as a mobile phone unit having a GPS function, a mobile phone device having a GPS receiving function or the like demodulates and analyzes positioning signals transmitted from plural GPS satellites and thus measures the current position. As a reference oscillator used for these receiving devices, a temperature compensated piezoelectric oscillator TCXO (Temperature Compensated Xtal Oscillator) having little frequency change depending on temperatures is broadly used. The reason for this broad use is that as the oscillator with a built-in receiving device has higher frequency accuracy, the search range for catching positioning signals transmitted from GPS satellites can be narrowed and consequently the position can be measured in a shorter time by reducing the search time, that is, by reducing the time to catch positioning signals from GPS satellites.

Meanwhile, at the time of startup of the above receiving device or the like, for example, at the time of turning on power of the device, temperature of the entire device rises in a short time. In the case of a mobile phone or the like, temperature quickly changes when the mobile phone is moved from outdoors to indoors or from indoors to outdoors. Therefore, there is a problem that temperature compensation is unstable until temperature is stabilized within the oscillator. To overcome this problem, it is demanded that a temperature compensation circuit capable of quickly responding to temperature changes is independently constructed on the user side and the oscillator acquires temperature information of a piezoelectric vibrator installed in the oscillator, whereby carrying out appropriate temperature compensation. To cope with this demand, a TSXO which does not require a temperature compensation circuit is applied on the oscillating circuit side, equipped with a temperature sensor which outputs the temperature of the installed piezoelectric vibrator to the user side, and a storage circuit which stores frequency temperature information (temperature coefficient) of the installed piezoelectric vibrator and outputs the frequency temperature information to the user side (as disclosed in JP-A-2003-324318).

In the case of using a crystal vibrator utilizing thickness-shear vibration, an oscillation signal outputted from the oscillator has temperature dependence drawing a positive cubic curve. In a GPS system or the like where the above TSXO is stalled and the user side has a temperature compensation circuit that is connected to the TSXO, the temperature compensation circuit calculates the quantity of temperature compensation and corrects the frequency so that the frequency becomes constant at any temperature, on the basis of temperature information acquired from the temperature sensor and frequency temperature information acquired from the storage circuit.

Here, the frequency temperature information stored in the storage circuit is acquired in the manufacturing and inspecting process. Therefore, in view of throughput at the time of manufacturing, generally, frequency temperature information in the case where temperature changes in either way, that is, at the time of temperature rise or temperature fall, is acquired and stored in the storage circuit.

By the way, the frequency temperature characteristic of the crystal vibrator has a hysteresis characteristic. Having a hysteresis characteristic means that the crystal vibrator has different temperature dependence at the time of temperature rise and at the time of temperature fall. The causes of this difference includes the fact that a change in strain stress of the crystal vibrator in response to a temperature change cannot follow the actual temperature change, and thermal strain changes or the like of the supporting structure, adhesive, deposited alloy, electrodes and the like in the oscillator. This difference becomes more conspicuous for a smaller crystal vibrator.

In the field of high-accuracy electronic devices such as mobile phone terminals equipped with the above GPS function, the tolerance range of frequency deviation ($\Delta f/f_0$) is very narrow, and for example, the frequency deviation ($\Delta f/f_0$) within the temperature range from −30° C. to 85° C. needs to be within ±0.5 ppm.

Therefore, with the method in which frequency temperature information in the case where temperature is changed either way, that is, at the time of temperature rise or temperature fall, is acquired and stored in the storage circuit, as in the traditional technique, only the frequency temperature information in one direction is saved. Therefore, if temperature changes in the opposite direction to the direction in the case of acquiring the frequency temperature information, even though frequency correction is carried out in the system, a difference in oscillation frequency due to the hysteresis characteristic remains as a correction error. This correction error causes problems such as the need for a longer time for positioning, the consequent occurrence of a positioning error, and the risk of tuning failure with GPS satellites.

SUMMARY

An advantage of some aspects of the invention is that a temperature compensation method for a piezoelectric oscillator and a piezoelectric oscillator are provided which enable oscillation at a stable oscillation frequency being reducing the influence of the hysteresis characteristic of the oscillation frequency of the piezoelectric vibrator.

The invention can solve at least a part of the problems described above and can be embodied as the following application examples.

APPLICATION EXAMPLE 1

According to this application example of the invention, there is provided a temperature compensation method for a piezoelectric oscillator. The piezoelectric oscillator includes a piezoelectric vibrator having a frequency temperature characteristic with a hysteresis characteristic, and an oscillation circuit which oscillates the piezoelectric vibrator and outputs an oscillation signal, wherein, to a temperature compensation circuit which can calculate a quantity of temperature compensation using frequency temperature information indicating a temperature characteristic of an oscillation frequency of the piezoelectric vibrator and temperature information of the piezoelectric vibrator at the time of oscillation of the oscillation signal, the oscillation signal and the frequency temperature information are outputted. The temperature compensation method includes calculating an intermediate value between elevated-temperature frequency temperature information of the piezoelectric vibrator that is generated in the case where ambient temperature of the piezoelectric vibrator is elevated and lowered-temperature frequency temperature information of the piezoelectric vibrator that is generated in the case where the ambient temperature is lowered, as the frequency temperature information.

With the above method, in the temperature compensation circuit, frequency temperature information as an intermediate value between elevated-temperature frequency temperature information of the piezoelectric vibrator that is generated in the case where the ambient temperature of the piezoelectric vibrator is elevated and lowered-temperature frequency temperature information of the piezoelectric vibrator that is generated in the case where the ambient temperature is lowered, is inputted. A frequency deviation from a reference frequency is calculated using the frequency temperature information and the temperature information of the piezoelectric vibrator at the time of oscillation of the piezoelectric vibrator. The quantity of temperature compensation is thus calculated. Therefore, whether the ambient temperature is elevated or lowered, a correction error due to the hysteresis characteristic of the piezoelectric vibrator can be restrained within a predetermined range.

APPLICATION EXAMPLE 2

According to this application example, in the temperature compensation method for the piezoelectric oscillator according to Application Example 1, the frequency temperature information is extracted from third approximation curve information that is calculated as an intermediate value between first approximation curve information calculated on the basis of the elevated-temperature frequency temperature information and representing a continuous temperature characteristic of the oscillation frequency and second approximation curve information calculated on the basis of the lowered-temperature frequency temperature information and representing a continuous temperature characteristic of the oscillation frequency.

With the above method, the frequency temperature information is extracted from intermediate approximation curve information that changes continuously in relation to temperature change. Meanwhile, in the temperature compensation circuit, an approximation curve of the oscillation frequency that changes continuously in relation to temperature change is formed on the basis of the frequency temperature information. Since the approximation curve calculated in the temperature compensation circuit is a third approximation curve, temperature compensation can be carried out highly accurately. Moreover, since the elevated-temperature frequency temperature information and the lowered-temperature frequency temperature information need not be measured at the same temperature position, the yield of the generation of the frequency temperature information is enhanced and the cost can be restrained.

APPLICATION EXAMPLE 3

According to this application example, in the temperature compensation method for the piezoelectric oscillator according to Application Example 1 or 2, the frequency temperature information is generated on the basis of temperature information, information of an oscillation frequency corresponding to the temperature information, or information of a frequency deviation from a reference frequency corresponding to the temperature information.

Thus, as no arithmetic operations to generate a temperature coefficient are required on the piezoelectric oscillator side, workload at the time of forming the piezoelectric oscillator can be restrained and the cost can be restrained. In this case, a temperature coefficient of a power series overlapping the plotting of the temperature information is calculated on the user side, and the quantity of temperature compensation is thus calculated. An accurate temperature coefficient can be calculated independently on the user side.

APPLICATION EXAMPLE 4

According to this application example, in the temperature compensation method for the piezoelectric oscillator according to Application Example 2, the frequency temperature information is generated on the basis of information of a temperature coefficient extracted from the third approximation curve information.

Thus, no arithmetic operations to calculate the temperature coefficient are required in the temperature compensation circuit. Therefore, a system equipped with a piezoelectric oscillator can easily be constructed with reduced burden on the user side.

APPLICATION EXAMPLE 5

According to this application example, in the temperature compensation method for the piezoelectric oscillator according to any one of Application Examples 1 to 4, the elevated-temperature frequency temperature information is calculated approximately by using the lowered-temperature frequency temperature information and information of temperature and frequency measured where the ambient temperature is elevated to a reference temperature zone.

As the difference between frequency components of the elevated-temperature frequency temperature information and the lowered-temperature frequency temperature information is taken, the difference reaches a maximum in the reference temperature zone and becomes smaller as away from the reference temperature. Thus, the elevated-temperature frequency temperature information can be calculated approximately by using the lowered-temperature frequency temperature information and information of temperature and frequency measured where the ambient temperature of the piezoelectric vibrator is elevated to the reference temperature zone. Therefore, it suffices to acquire the information of temperature and frequency at the time of temperature rise only within the reference temperature zone, and the process of elevating temperature to a higher temperature zone than the reference temperature is not necessary. As the time taken for acquiring the elevated-temperature frequency temperature information can be reduced, workload can be reduced and the cost can be retrained.

APPLICATION EXAMPLE 6

According to this application example, in the temperature compensation method for the piezoelectric oscillator according to any one of Application Examples 1 to 4, the lowered-temperature frequency temperature information is calculated approximately by using the elevated-temperature frequency temperature information and information of temperature and frequency measured where the ambient temperature is lowered to a reference temperature zone.

For the same reason as in Application Example 5, the lowered-temperature frequency temperature information can be calculated approximately by using the elevated-temperature frequency temperature information and information of temperature and frequency measured where the ambient temperature of the piezoelectric vibrator is lowered to the reference temperature zone. Moreover, it suffices to measure the reference temperature zone at the time of temperature fall, and it is not necessary to measure a lower temperature zone than the reference temperature. As the time taken for acquiring the lowered-temperature frequency temperature information can be reduced, workload can be reduced and the cost can be retrained.

APPLICATION EXAMPLE 7

According to this application example, in the temperature compensation method for the piezoelectric oscillator according to any one of Application Examples 1 to 6, a temperature detection unit which outputs a detected voltage corresponding to the ambient temperature is arranged near the piezoelectric vibrator. The elevated-temperature frequency temperature information and the lowered-temperature frequency temperature information are generated as functions of the detected voltage. The frequency temperature information is calculated on the basis of the elevated-temperature frequency temperature information and the lowered-temperature frequency temperature information. The oscillation signal is outputted to a temperature compensation circuit which can calculate a quantity of temperature compensation based on the frequency temperature information and the detected voltage. The detected voltage is outputted to the temperature compensation circuit from the temperature detection unit.

With the above method, the temperature detection unit can measure the ambient temperature of the piezoelectric vibrator while restraining a measurement error. Therefore, the elevated-temperature frequency temperature information and the lowered-temperature frequency temperature information can be generated highly accurately and the frequency temperature information can be calculated highly accurately.

Moreover, since the temperature information of the piezoelectric vibrator can be measured in real time and highly accurately, a correction error in the temperature compensation circuit can be restrained and highly accurate temperature compensation can be carried out.

APPLICATION EXAMPLE 8

According to this application example, there is provided a piezoelectric oscillator including a piezoelectric vibrator having a frequency temperature characteristic with a hysteresis characteristic, an oscillation circuit which oscillates the piezoelectric vibrator and outputs an oscillation signal, and a storage circuit. In the storage circuit, frequency temperature information is stored which shows a frequency temperature characteristic in a zone surrounded by two frequency temperature characteristics of the oscillation signal appearing in response to the influence of the hysteresis characteristic.

The two frequency temperature characteristics refer to the frequency temperature characteristic shown at the time of temperature rise in the piezoelectric vibrator, and the frequency temperature characteristic shown at the time of temperature fall. In the above configuration, in the case where the piezoelectric oscillator is connected to a temperature compensation circuit, the temperature compensation circuit calculates a frequency deviation from a reference frequency, using frequency temperature information in the zone surrounded by the two frequency temperature characteristics of the piezoelectric vibrator and temperature information of the piezoelectric vibrator at the time of oscillation of the piezoelectric vibrator, and thus calculates the quantity of temperature compensation. Thus, whether the ambient temperature is elevated or lowered, a correction error due to the hysteresis characteristic of the piezoelectric vibrator can be restrained within a predetermined range, in the piezoelectric oscillator. Moreover, since the storage circuit does not have to store the elevated-temperature frequency temperature information, the lowered-temperature frequency temperature information or the temperature information extracted from these pieces of information, increase in capacity load on the storage circuit can be avoided.

APPLICATION EXAMPLE 9

According to this application example, in the piezoelectric oscillator according to Application Example 8, the frequency temperature information is generated on the basis of temperature information, information of an oscillation frequency corresponding to the temperature information, or information of a frequency deviation from a reference frequency corresponding to the temperature information.

Thus, since no arithmetic operations to generate a temperature coefficient are required on the piezoelectric oscillator side, workload at the time of forming the piezoelectric oscillator can be restrained and the cost of the piezoelectric oscillator can be restrained. Particularly in the case of storing a frequency deviation, as the number of digits decreases, the data volume can be reduced. The storage circuit can be thus miniaturized and the cost can be restrained.

APPLICATION EXAMPLE 10

According to this application example, in the piezoelectric oscillator according to Application Example 8, the frequency temperature information is a temperature coefficient extracted from approximation curve information with a power series corresponding to the frequency temperature characteristic.

Thus, in the case where the piezoelectric oscillator is connected to a temperature compensation circuit, the temperature compensation circuit needs no arithmetic operations to generate a temperature coefficient. Therefore, the piezoelectric oscillator enables easy construction of a system equipped with an oscillation circuit with reduced burden on the user side.

APPLICATION EXAMPLE 11

According to this application example, in the piezoelectric oscillator according to any one of Application Examples 8 to 10, a temperature detection unit which outputs a detected voltage corresponding to the ambient temperature is provided near the piezoelectric vibrator. The frequency temperature information is calculated on the basis of the elevated-temperature frequency temperature information and the lowered-temperature frequency temperature information expressed as functions of the detected voltage and is stored in the storage circuit. The oscillation circuit outputs an oscillation signal to a temperature compensation circuit which calculates a quantity of temperature compensation using the frequency temperature information and the detected voltage. The temperature detection unit outputs the detected voltage to the temperature compensation circuit.

With the above configuration, the temperature detection unit can measure the ambient temperature of the piezoelectric vibrator while restraining a measurement error. Therefore, the elevated-temperature frequency temperature information and the lowered-temperature frequency temperature information can be calculated highly accurately and the frequency temperature information can be acquired highly accurately. Moreover, since the temperature information of the piezoelectric vibrator can be measured in real time and highly accurately, a correction error in the temperature compensation circuit can be restrained and highly accurate temperature compensation can be carried out in the piezoelectric oscillator.

BRIEF DESCRIPTION OF THE DRAWINGS

The invention will be described with reference to the accompanying drawings, wherein like numbers reference like elements.

FIG. 7 shows a table in which the volumes of frequency temperature information stored in a storage circuit are compared.

DESCRIPTION OF EXEMPLARY EMBODIMENTS

Hereinafter, the invention will be described in detail using an embodiment with reference to the drawings. The components, and their kinds, combinations, shapes, relative arrangements and so on described in the embodiment should not limit the scope of the invention unless so described, and these descriptions are simply explanatory examples.

Figure 1:
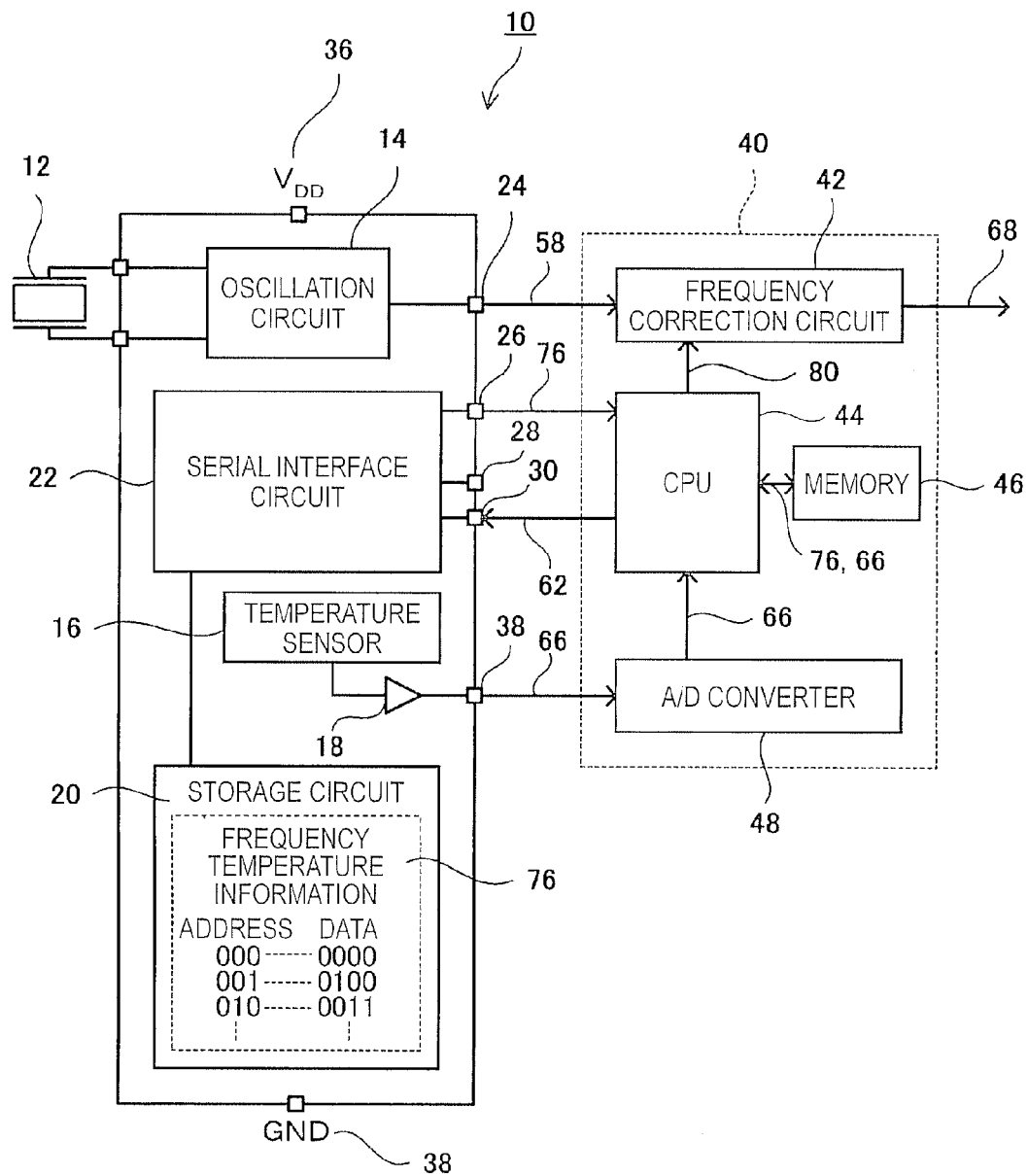
FIG. 1 is a schematic view of a piezoelectric oscillator according to an embodiment, connected to a temperature compensation circuit.

FIG. 1 shows a piezoelectric oscillator according to this embodiment which is an oscillation circuit system and is connected to a temperature compensation circuit. A piezoelectric oscillator 10 has a piezoelectric vibrator 12 which has a frequency temperature characteristic with a hysteresis characteristic, an oscillation circuit 14 which oscillates the piezoelectric vibrator 12 and outputs an oscillation signal 58, and a storage circuit 20. In the storage circuit 20, frequency temperature information 76 is stored which shows a frequency temperature characteristic in a zone surrounded by two frequency temperature characteristics of the oscillation signal appearing in response to the influence of the hysteresis characteristic. Here, the two frequency temperature characteristics refer to the frequency temperature characteristic shown at the time of temperature rise in the piezoelectric vibrator 12 and the frequency temperature characteristic shown at the time of temperature fall. A zone surrounded by two characteristic curves emerges around a reference temperature as the center. At the time of operation, the piezoelectric oscillator 10 is connected to a temperature compensation circuit 40.

More specifically, the piezoelectric oscillator 10 according to the embodiment has: the piezoelectric vibrator 12 which has a frequency temperature characteristic with a hysteresis characteristic; the oscillation circuit 14 which oscillates the piezoelectric vibrator 12 and outputs the oscillation signal 58 and which outputs the oscillation signal 58 to the temperature compensation circuit 40 capable of calculating a quantity of temperature compensation 80 using the frequency temperature information 76 showing the temperature characteristic of the oscillation frequency of the piezoelectric vibrator 12 and temperature information of the piezoelectric vibrator 12 at the time of oscillation of the oscillation signal 58; and the storage circuit 20 which stores an intermediate value between elevated-temperature frequency temperature information 77a of the piezoelectric vibrator 12 generated in the case where the ambient temperature of the piezoelectric vibrator 12 is elevated and lowered-temperature frequency temperature information 77b of the piezoelectric vibrator 12 generated in the case where the ambient temperature is lowered, as the frequency temperature information 76, and outputs the frequency temperature information 76 to the temperature compensation circuit 40.

Moreover, a temperature detection unit (temperature sensor 16) which outputs a detected voltage 66 corresponding to the ambient temperature is provided near the piezoelectric vibrator 12. The frequency temperature information 76 is calculated on the basis of the elevated-temperature frequency temperature information 77a and the lowered-temperature frequency temperature information 77b expressed as functions of the detected voltage 66 and is stored in the storage circuit 20. The oscillation circuit 14 outputs the oscillation signal 58 to the temperature compensation circuit 40 which calculates the quantity of temperature compensation 80 using the frequency temperature information 76 and the detected voltage 66. The temperature detection unit outputs the detected voltage 66 to the temperature compensation circuit 40.

Thus, the temperature compensation method for the piezoelectric oscillator 10 using the above configuration is a temperature compensation method for the piezoelectric oscillator 10 having the piezoelectric vibrator 12 which has a frequency temperature characteristic with a hysteresis characteristic, and the oscillation circuit 14 which oscillates the piezoelectric vibrator 12 and outputs the oscillation signal 58, wherein the oscillation signal 58 and the frequency temperature information 76 are outputted to the temperature compensation circuit 40 which can calculate the quantity of temperature compensation 80 using the frequency temperature information 76 showing the temperature characteristic of the oscillation frequency of the piezoelectric vibrator 12 and the temperature information of the piezoelectric vibrator 12 at the time of oscillation of the oscillation signal 58. In the method, the intermediate value between the elevated-temperature frequency temperature information 77a of the piezoelectric vibrator 12 generated in the case where the ambient temperature of the piezoelectric vibrator 12 is elevated and the lowered-temperature frequency temperature information 77b of the piezoelectric vibrator 12 generated in the case where the ambient temperature is lowered, is calculated as the frequency temperature information 76.

Moreover, the temperature detection unit (temperature sensor 16) which outputs the detected voltage 66 corresponding to the ambient temperature is provided near the piezoelectric vibrator 12. The elevated-temperature frequency temperature information 77a and the lowered-temperature frequency temperature information 77b are generated as functions of the detected voltage 66. The frequency temperature information 76 is calculated on the basis of the elevated-temperature frequency temperature information 77a and the lowered-temperature frequency temperature information 77b. The oscillation signal 58 is outputted to the temperature compensation circuit 40 which calculates the quantity of temperature compensation 80 using the frequency temperature information 76 and the detected voltage 66. The detected voltage 66 is outputted to the temperature compensation circuit 40 from the temperature detection unit.

Prior to the explanation of the configuration of the piezoelectric oscillator according to the embodiment, how temperature compensation is carried out in the piezoelectric oscillator 10 according to the embodiment will be described with reference to the drawings. The frequency temperature information 76 is data about the frequency temperature characteristic of the intermediate value between the two frequency temperature characteristics appearing with the hysteresis characteristic of the oscillation signal 58 of the oscillation circuit 14. That is, FIG. 5A to FIG. 5C illustrate the frequency temperature information 76.

Figure 5A:
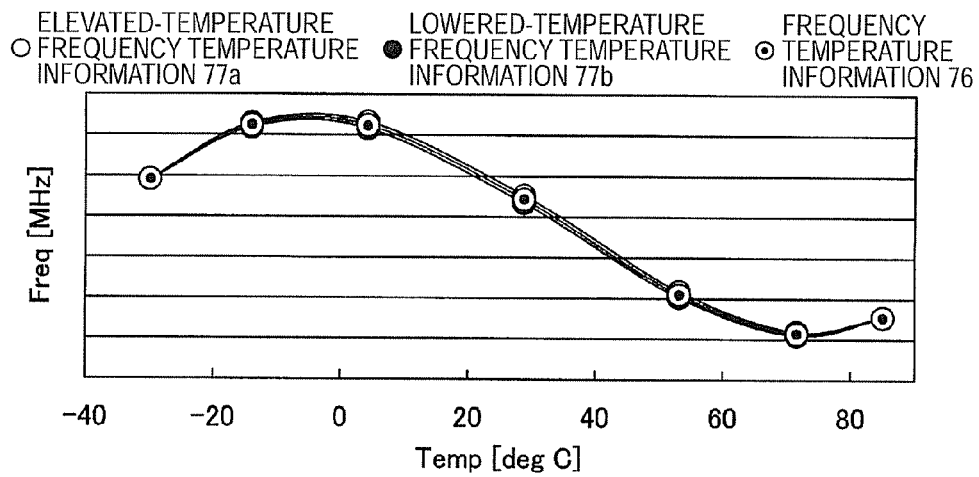
FIG. 5A to FIG. 5C show the frequency deviation in the case where temperature compensation is carried out using the temperature coefficient according to the embodiment.
Figure 5B:
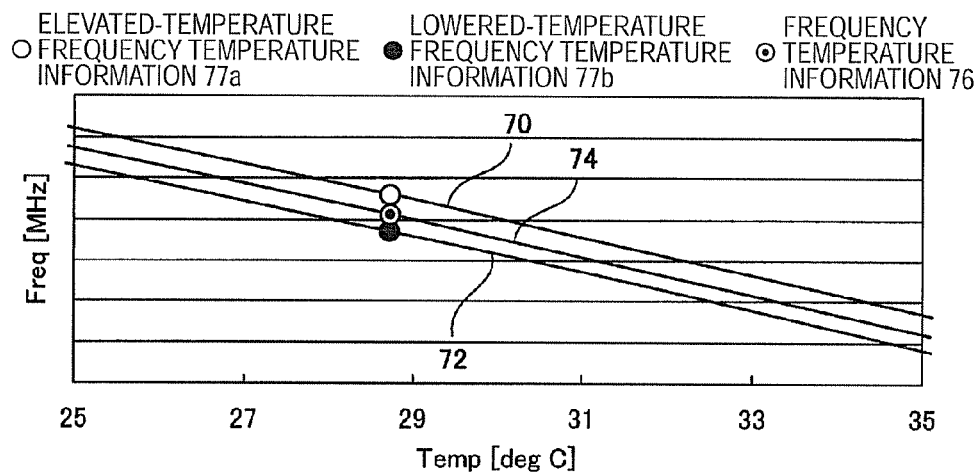
Figure 5C:
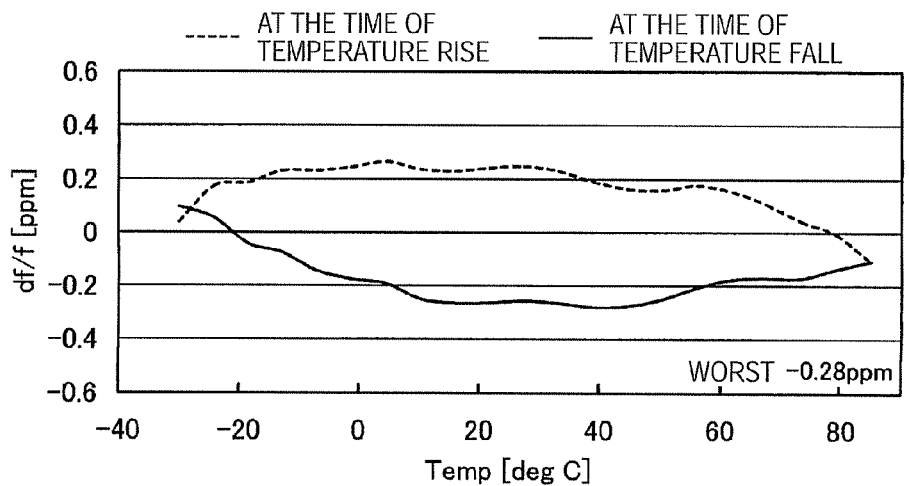

The elevated-temperature frequency temperature information 77a shown in FIG. 5A and FIG. 5B is the plotted frequencies of the oscillation signal 58 of the oscillation circuit 14 at every predetermined temperature during a period when the ambient temperature of the piezoelectric vibrator 12, which is an AT-cut crystal vibrator, is elevated from −30° C. to +85° C. across the reference temperature of the piezoelectric vibrator 12 (for example, 25° C.). The lowered-temperature frequency temperature information 77b is the plotted frequencies of the oscillation signal 58 of the oscillation circuit 14 at every predetermined temperature during a period when the ambient temperature is lowered from +85° C. to −30° C.

First approximation curve information 70 is generated by calculating a temperature coefficient in Equation 1, which will be described later, in accordance with the elevated-temperature frequency temperature information 77a. The first approximation curve information 70 is a curve on which the frequency can be calculated continuously in relation to temperature change. Second approximation curve information 72 is generated by calculating a temperature coefficient in Equation 1, which will be described later, in accordance with the lowered-temperature frequency temperature information 77b. The second approximation curve information 72 is a curve on which the frequency can be calculated continuously in relation to temperature change. Third approximation curve information 74 is generated as an intermediate value between the first approximation curve information 70 and the second approximation curve information 72. Therefore, as temperature information and a frequency in the temperature information that are necessary for the frequency temperature information 76 are extracted from the third approximation curve information 74, the frequency temperature information 76 can be generated. Here, the intermediate value not only refers to an intermediate value in the direction of frequency acquired by adding up and averaging the two frequency temperature characteristics, that is, the first approximation curve information 70 and the second approximation curve information (the elevated-temperature frequency temperature information 77a and the lowered-temperature frequency temperature information 77b) at one temperature position, but also includes a value displaced in the direction of frequency within the zone surrounded by the hysteresis characteristic.

The frequency temperature information 76 generated in this manner is used for finding a parameter (coefficient) in a polynomial expression (Equation 1) for temperature compensation, which will be described later, by calculating an approximation.

The temperature compensation circuit 40 calculates a coefficient that is necessary to form a polynomial expression for frequency temperature compensation, by calculating an approximation using the frequency temperature information 76, and decides the polynomial expression for frequency temperature compensation. Moreover, the temperature compensation circuit 40 corrects the oscillation frequency of the oscillation signal 58 of the oscillation circuit 14 in accordance with the quantity of temperature compensation 80 (quantity of frequency correction) decided by using the polynomial expression for frequency temperature compensation and the information of temperature (detected voltage 66) detected by the temperature sensor 16, and outputs a temperature-compensated oscillation signal 68.

Thus, in the temperature compensation method for the oscillation circuit system having the piezoelectric oscillator 10 according to this embodiment, information of a frequency temperature characteristic having a continuous frequency temperature characteristic with respect to temperature change or a coefficient that is necessary for a polynomial expression for frequency temperature compensation (third approximation curve information 74) to correct the information of the frequency temperature information is calculated on the basis of the frequency temperature information 76. Then, frequency control such as frequency division is carried out to the oscillation signal 58 from the oscillation circuit 14 on the basis of information acquired by calculating the quantity of temperature compensation 80 using the information of the frequency temperature characteristic or the polynomial expression decided by the coefficient, and the information of the temperature (detected voltage 66) detected by the temperature sensor 16, and thus the temperature-compensated oscillation signal 68 is outputted. To realize this temperature compensation method, the piezoelectric oscillator 10 needs to have at least the piezoelectric vibrator 12, the oscillation circuit 14, the temperature sensor 16, and the storage circuit 20.

Next, the process of generating the elevated-temperature frequency temperature information 77a and the lowered-temperature frequency temperature information 77b will be described.

After the piezoelectric oscillator 10 (piezoelectric vibrator 12) according to the embodiment is housed, for example, in a chamber (not shown) in which temperature can be set, a first temperature test is carried out in which the ambient temperature of the piezoelectric oscillator 10 (piezoelectric vibrator 12) is changed from a low temperature toward a high temperature and the frequency of the oscillation signal 58 of the oscillation circuit 14 is measured at plural temperature points during the temperature change.

In the first temperature test, if the case of using an AT-cut crystal vibrator as the piezoelectric vibrator 12 is described as an example, the ambient temperature of the piezoelectric vibrator 12 is elevated, for example, from −30° C. toward +85° C., the frequency of the oscillation signal 58 of the oscillation circuit 14 is measured at plural temperature points during the temperature elevation. Thus, the elevated-temperature frequency temperature information 77a is generated. In the example shown in FIG. 5A, as the plural temperature points, seven temperature points are employed (elevated-temperature frequency temperature information 77a), including −30° C. (lowest setting temperature) and +85° C. (highest setting temperature) which are the temperatures at the edges of the temperature setting range, +25° C. (reference temperature) near an inflection point on the information of the frequency temperature characteristic curve (similar to the third approximation curve information 74), a temperature point near the point where the maximum value or minimum value on the curve occurs, temperature points between the extreme values and the temperatures at the edges or between the extreme values and the reference value, and so on. Here, the elevated-temperature frequency temperature information 77a includes the information of the setting temperature (or measured temperature) of the piezoelectric oscillator 10 and the information of the frequency of the oscillation signal 58 of the oscillation circuit 14 at that setting temperature (or measured temperature).

After the first temperature test, a second temperature test is carried out in which the ambient temperature of the piezoelectric oscillator 10 (piezoelectric vibrator 12) is changed from a high temperature toward a low temperature so that a tendency of temperature change in the opposite direction to that of the first temperature test is realized, and the frequency of the oscillation signal 58 of the oscillation circuit 14 is measured at plural temperature points during the temperature change.

In the second temperature test, too, if the case of using an AT-cut crystal vibrator as the piezoelectric vibrator 12 is described as an example, the ambient temperature of the piezoelectric oscillator 10 (piezoelectric vibrator 12) is lowered from +85° C. toward −30° C. and the frequency of the oscillation signal 58 of the oscillation circuit 14 is measures at plural temperature points during the temperature fall. Thus, the lowered-temperature frequency temperature information 77b is generated.

In the example shown in FIG. 5A, as the plural temperature points, seven temperature points are employed (lowered-temperature frequency temperature information 77b), including −30° C. (lowest setting temperature) and +85° C. (highest setting temperature) which are the temperatures at the edges of the variable temperature range, +25° C. (reference temperature) near an inflection point on the curve of the information of the frequency temperature characteristic (similar to the third approximation curve information 74), a temperature point near the point where the maximum value or minimum value on the curve occurs, temperature points between the extreme values and the temperatures at the edges or between the extreme values and the reference value, and so on. Here, the lowered-temperature frequency temperature information 77b includes the information of the setting temperature (or measured temperature) of the piezoelectric oscillator 10 and the information of the frequency of the oscillation signal 58 of the oscillation circuit 14 at that setting temperature (or measured temperature).

The first approximation curve information 70 corresponding to the elevated-temperature frequency temperature information 77a, and the second approximation curve information 72 corresponding to the lowered-temperature frequency temperature information 77b are calculated. The third approximation curve information 74 is generated using a temperature coefficient which is an intermediate value generated by adding up and averaging the temperature coefficients of the first approximation curve information 70 and the second approximation curve information 72. Then, information of a temperature required for the frequency temperature information 76 and the frequency corresponding to the information of the temperature are extracted from the third approximation curve information 74. The frequency temperature information 76 is thus generated. The frequency temperature information 76 acquired in this manner is stored in the storage circuit 20.

In this case, in the example shown in FIG. 5A, the temperature points indicated by the frequency temperature information 76 are the seven temperature points, including −30° C. and +85° C. which are the temperatures at the edges of the variable temperature range, +25° C. (reference temperature) near an inflection point in the first approximation curve information 70 and the second approximation curve information 72, the temperature point near the extreme value point where the maximum value or minimum value of the first approximation curve information 70 and the second approximation curve information 72 occurs, or the temperature points between the extreme values and the temperatures at the edges or between the extreme values and the reference value.

The setting values of the lowest setting temperature and the highest setting temperature may be decided from an operable temperature range that is required at least in the piezoelectric oscillator 10. The temperature points as measuring points may be positions where frequency information can be acquired such that a curve as information of the frequency temperature characteristic can be found by approximation calculation.

At temperature points where the frequency values indicated by the elevated-temperature frequency temperature information 77a and the lowered-temperature frequency temperature information 77b are relatively close to each other, such as the temperature points at the edges of the variable temperature range, the information about the frequency of the frequency temperature information 76 may coincide with the information of the frequency of the elevated-temperature frequency temperature information 77a or the lowered-temperature frequency temperature information 77b. That is, at the above temperature points, the information of the frequency of the elevated-temperature frequency temperature information 77a or the lowered-temperature frequency temperature information 77b may be employed directly as the information of the frequency of the frequency temperature information 76.

Figure 2:
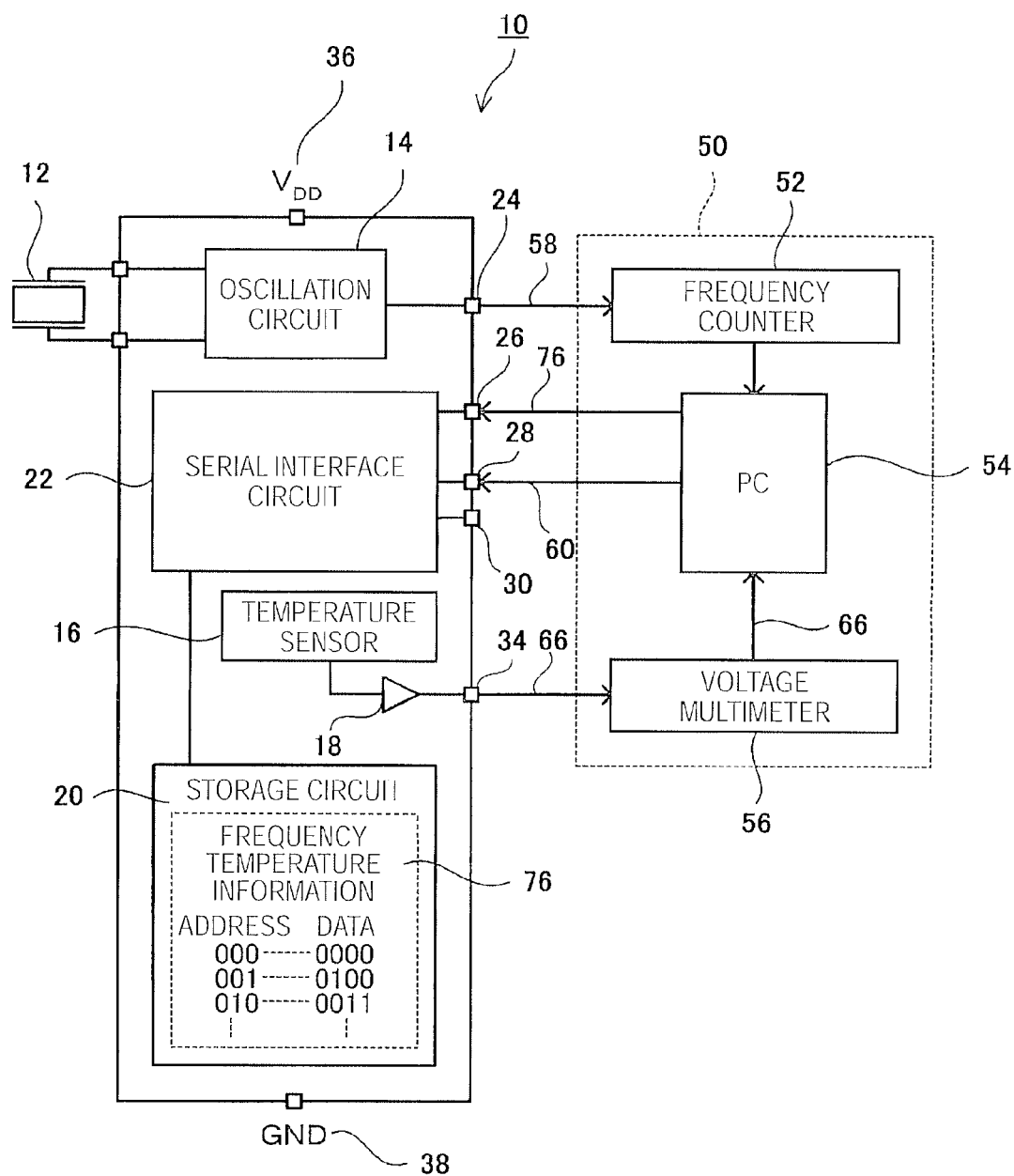
FIG. 2 shows the connection between the piezoelectric oscillator and a measuring device according to the embodiment.

Next, the specific configuration of this embodiment will be described. The specific configuration of the piezoelectric oscillator 10 includes a semiconductor circuit board having the oscillation circuit 14, the temperature sensor 16, a buffer 18, the storage circuit 20, a serial interface circuit 22 and terminals such as a power-supply terminal 36 and a ground terminal 38 which are formed on a silicon substrate (not shown) by patterning, and has a structure in which the oscillation circuit 14 and the piezoelectric vibrator 12 are connected to each other. Moreover, as shown in FIG. 1, the temperature compensation circuit 40 to be connected with the piezoelectric oscillator 10 has a frequency correction circuit 42, a CPU 44 as an arithmetic processing circuit, a memory 46 as a storage device, and an A/D converter 48 as an analog-digital converter, and is configured in the form of an integrated circuit on the above silicon substrate or on a different silicon substrate. At the time of calculating the frequency temperature information 76, the piezoelectric oscillator 10 is connected to a measuring device 50 as shown in FIG. 2. The measuring device 50 has a frequency counter 52, a PC (personal computer) 54, and a voltage multimeter 56.

The piezoelectric vibrator 12 is made of a piezoelectric material such as crystal, lithium niobate or lithium tantalate. It is preferable to use an AT-cut crystal vibrator that has relatively good frequency temperature characteristic and can restrain the quantity of temperature compensation for frequency. The resonance frequency of the piezoelectric vibrator using thickness-shear vibration due to this AT-cut has temperature dependency that is expressed by the positive cubic curve about the reference temperature (25° C.) or the polynomial function having the maximum value on the lower temperature side than the reference temperature and the minimum value on the higher temperature side as shown in FIG. 5A.

The oscillation circuit 14 is, for example, a Colpitts oscillation circuit using the piezoelectric vibrator 12 as its oscillation source. The oscillation circuit 14 outputs the oscillation signal 58 to the temperature compensation circuit 40 or the measuring device 50 via an oscillation frequency output terminal 24.

The temperature sensor 16 has a diode structure. As a forward current flows, the temperature sensor 16 outputs the detected voltage 66 as the potential between the terminals of the diode that changes depending on temperatures, to the temperature compensation circuit 40 or the measuring device 50 from a temperature sensor voltage output terminal 34 via the buffer 18. The temperature sensor 16 constantly outputs the detected voltage 66 as long as power is supplied from a power-supply voltage ($V_{DD}$). Here, the detected voltage 66 decreases in the manner of a linear function with temperature rise. The detected voltage 66 that is outputted corresponds to the measured temperature. It is desirable that the temperature sensor 16 is arranged near the piezoelectric vibrator 12. Thus, the ambient temperature of the piezoelectric vibrator 12 can be measured accurately and the correspondence between temperature and frequency or frequency deviation can be accurately taken in the elevated-temperature frequency temperature information 77a, the lowered-temperature frequency temperature information 77b, the first approximation curve information 70, the second approximation curve information 72, the third approximation curve information 74 and the frequency temperature information 76, which will be described later.

The serial interface circuit 22 stores the frequency temperature information 76 in the storage circuit 20 or outputs the frequency temperature information 76 stored in the storage circuit 20 to outside, in response to a command from outside. The serial interface circuit 22 is connected to the storage circuit 20 and the temperature sensor 16 and has a data input-output terminal 26, a first control clock input terminal 28 and a second control clock input terminal 30.

As a first control clock 60 is inputted to the first control clock input terminal 28, the serialized frequency temperature information 76 inputted to the data input-output terminal 26 can be stored (written) in the storage circuit 20, triggered by the first control clock 60 (synchronized with the first control clock 60). As s second control clock 62 inputted to the second control clock input terminal 30, the frequency temperature information 76 stored in the storage circuit 20 is serialized and outputted via the data input-output terminal 26, triggered by the second control clock 62.

The storage circuit 20 is formed by an EEPROM or the like. The frequency temperature information 76 can be stored (written) in the storage circuit 20 via the serial interface circuit 22 or the frequency temperature information 76 can be outputted from the storage circuit 20. The frequency temperature information 76 includes a finite number of data, each of which has an address that is commonly recognized by the PC 54 as the arithmetic unit in the measuring device 50 and by the CPU 44 in the temperature compensation circuit 40.

As the frequency temperature information 76, a combination of a temperature coefficient and an offset coefficient, which will be described later, or a combination of plural pieces of temperature information that are arbitrarily selected from the temperature range for the use of the piezoelectric vibrator 12 and information of a frequency corresponding to each of the plural pieces of temperature information or information of a frequency deviation from a reference frequency corresponding to the plural pieces of temperature information, can be used. Of these, in the case of the combination of plural pieces of temperature information and information of a frequency deviation from a reference frequency corresponding to each of the plural pieces of temperature information, the number of digits of the information can be made smaller than in the case where the absolute value of the oscillation frequency is used. Therefore, the frequency temperature information 76 has the smallest volume. In the case of storing a temperature coefficient as the frequency temperature information 76, the temperature itself need not be stored and therefore the volume of the frequency temperature information 76 can be reduced. In the case of using the above combination of plural pieces of temperature information and information of a frequency corresponding to each of the plural pieces of temperature information, as the frequency temperature information 76, it is necessary to acquire a reference temperature and information of the frequency at the reference temperature and to give an address that can be identified from other information by the PC 54 and the CPU 44, to that combination.

FIG. 2 shows the connection between the piezoelectric oscillator 10 and the measuring device 50. The measuring device 50 calculates the frequency temperature information 76 used in the temperature compensation circuit 40 on the basis of the temperature characteristic of the oscillation frequency of the piezoelectric vibrator 12 installed in the oscillation circuit 14 and writes the frequency temperature information 76 into the storage circuit 20. The measuring device 50 includes the frequency counter 52, the PC 54, and the voltage multimeter 56. The frequency counter 52 is connected to the oscillation circuit 14 and can measure the frequency of the oscillation signal 58 outputted from the oscillation circuit 14 at every predetermined time interval and output the frequency to the PC 54. The voltage multimeter 56 can convert the detected voltage 66 from the temperature sensor 16 to digital data and output the digital data to the PC 54.

The PC 54 is connected to the data input-output terminal 26, the first control clock input terminal 28, the frequency counter 52 and the voltage multimeter 56. The PC 54 can start up the frequency counter 52 and the voltage multimeter 56 by key operation or the like and constantly receives the input of the detected voltage 66 (information of ambient temperature) from the temperature sensor 16 via the voltage multimeter 56. The PC 54 also receives the input of the frequency at every predetermined temperature from the frequency counter 52 in accordance with an installed program and stores the detected voltage 66 (information of ambient temperature) and the frequency in a storage area (not shown) within the PC.

With respect to the resonance frequency of the piezoelectric vibrator using thickness-shear vibration, if the reference frequency at a reference temperature $T_0$ is f, the frequency temperature information $\Delta f/f$ at an arbitrary temperature T can be expressed approximately by the following power series.

$$\Delta f/f = A(T-T_0)^4 + B(T-T_0)^3 + C(T-T_0)^2 + D(T-T_0) + E \quad (1)$$

Here, A, B, C and D represent temperature coefficients that decide an approximation curve of frequency temperature information. E represents an offset coefficient which decides an offset of the frequency temperature information and belongs to temperature coefficients. The temperature compensation circuit 40 needs to calculate frequency temperature information that continuously changes in relation to the temperature change as expressed by Equation 1.

By the way, there are five variables in Equation 1. Therefore, for example, if at least there are five combinations of information of measured ambient temperature (detected voltage 66) and information of a frequency deviation from a reference frequency corresponding to the information of the ambient temperature as the frequency temperature information 76, these combinations can be substituted in Equation 1 to solve simultaneous linear equations in five unknowns, thereby calculating all the variables in Equation 1. Thus, approximation curve information can be calculated. Moreover, by calculating temperature coefficients that satisfy Equation 1 by the least square method on the basis of the information of the frequency at seven temperature points as described above, it is possible to generate a more accurate approximation curve. However, since the piezoelectric vibrator has a hysteresis characteristic, temperature information acquired at the time of temperature rise and temperature information acquired at the time of temperature fall need to be considered.

Thus, during the period when the ambient temperature of the piezoelectric vibrator 12 elevated from the lowest setting temperature (−30° C.) to the highest setting temperature (+85° C.) over the reference temperature (+25° C.), the PC 54 measures the frequency (elevated-temperature frequency temperature information 77a) at predetermined temperature intervals according to a program or the like. After that, while the ambient temperature is lowered from the highest setting temperature to the lowest setting temperature over the reference temperature, the PC 54 measures the frequency (lowered-temperature frequency temperature information 77b) at predetermined temperature intervals.

The PC 54 calculates the first approximation curve information 70 (see FIG. 5A to FIG. 5C) using the elevated-temperature frequency temperature information 77a generated at the time of temperature rise (for example, the temperatures at seven points and the frequency deviation corresponding to the temperatures) and Equation 1. The PC 54 also calculates the second approximation curve information 72 (see FIG. 5A to FIG. 5C) using the lowered-temperature frequency temperature information 77b generated at the time of temperature fall (for example, the temperatures at seven points and the frequency deviation corresponding to the temperatures) and Equation 1.

Next, for example, an arithmetic operation to add up and average the frequency components of the first approximation curve information 70 and the second approximation curve information 72 is carried out and the third approximation curve information 74 (see FIG. 5A to FIG. 5C) which is the intermediate value between the first approximation curve information 70 and the second approximation curve information 72 is calculated. Similarly, this operation is carried out with respect to other temperatures (for example, arbitrary temperatures of −30° C. to +85° C.). Then, a combination of plural pieces of temperature information with which the temperature compensation circuit 40 can easily calculate the third approximation curve information 74 and the frequency corresponding to the temperature information is properly extracted from the third approximation curve information 74. An address that can be recognized by the CPU 44 in the temperature compensation circuit 40 is appended to the extracted combination of information, thus generating the frequency temperature information 76.

After the frequency temperature information 76 is constructed in the PC 54 as described above, the PC 54 outputs the first control clock 60 to the first control clock input terminal 28, outputs the frequency temperature information 76 in the form of serial data to the data input-output terminal 26 synchronously with the first control clock 60, and stores the frequency temperature information 76 in the storage circuit 20 via the serial interface circuit 22.

As shown in FIG. 1, the temperature compensation circuit 40 is a part of the external system separated from the piezoelectric oscillator 10. The temperature compensation circuit 40 calculates approximation curve information (similar to the third approximation curve information 74) corresponding to continuous temperature change of the oscillation frequency of the piezoelectric vibrator 12, using the frequency temperature information 76 inputted to the storage circuit 20 from the PC 54, and calculates the quantity of temperature compensation 80 based on the approximation curve information and the detected voltage 66 (information of ambient temperature) that is constantly inputted from the temperature sensor 16. The temperature compensation circuit 40 includes the frequency correction circuit 42, the CPU 44, the memory 46 and the like. The frequency correction circuit 42 is a circuit which varies the frequency of the oscillation signal 58 in accordance with the quantity of temperature compensation 80 outputted from the CPU 44. The frequency correction circuit 42 is connected with the oscillation circuit 14 so that the oscillation signal 58 is inputted to the frequency correction circuit 42. The frequency correction circuit 42 outputs the temperature-compensated oscillation signal 68 under the control of the CPU 44.

The CPU 44 is the center of the temperature compensation circuit 40. The CPU 44 calculates the approximation curve information (the same as the third approximation curve information 74) on the basis of the frequency temperature information 76 inputted from the storage circuit 20, calculates the quantity of temperature compensation 80 on the basis of the approximation curve information and the detected voltage 66 (information of ambient temperature) inputted from the temperature sensor 16, and outputs the calculated quantity of temperature compensation to the frequency correction circuit 42. If the elevated-temperature frequency temperature information 77a is stored in the storage circuit 20, the CPU 44 calculates approximation curve information similar to the first approximation curve information 70. If the lowered-temperature frequency temperature information 77b is stored, the CPU 44 calculates approximation curve information similar to the second approximation curve information 72.

The CPU 44 is connected to the data input-output terminal 26, the second control clock input terminal 30 and the frequency correction circuit 42, and is also connected to the temperature sensor 16 via the A/D converter 48. The CPU 44 inputs the second control clock 62 to the second control clock input terminal 30 according to a program at the time of startup, outputs the frequency temperature information 76 in the storage circuit 20 from the data input-output terminal 26 via the serial interface circuit 22 synchronously with the second control clock 62, and stores the frequency temperature information 76 in the memory 46 attached to the CPU 44.

If the frequency temperature information 76 stored in the storage circuit 20 is a combination of plural pieces of temperature information within the temperature range for the use of the piezoelectric vibrator 12 and a frequency deviation corresponding to each of the plural pieces of temperature information, the CPU 44 is configured to be capable of using the frequency temperature information 76 and Equation 1 to calculate the temperature coefficients in Equation 1 and the offset coefficient by the foregoing method and then storing the calculated coefficients in the attached memory 46. If the frequency temperature information 76 is the above plural pieces of temperature information and information of a frequency (absolute value) corresponding each piece of temperature information, the CPU 44 is configured to be capable of identifying the addresses of the information of the reference temperature and the information of the frequency measured at the reference temperature, of the frequency temperature information 76, then using the frequency temperature information 76 and Equation 1 to calculate the temperature coefficients in Equation 1 and the offset coefficient by the foregoing method, and storing the calculated coefficients in the attached memory 46. If the frequency temperature information 76 stored in the storage circuit 20 is the temperature coefficients and the offset coefficient, the CPU 44 is configured to store these coefficients directly in the attached memory 46.

The CPU 44 also digitizes and inputs the detected voltage 66 (information of ambient temperature) from the temperature sensor 16 via the A/D converter 48 every predetermined time according to a program or the like, and stores the digitized information in the attached memory 46. The CPU 44 reads out the temperature coefficients and the offset coefficient from the memory 46 and calculates the approximation curve (third approximation curve information 74). The CPU 44 also reads out the detected voltage 66 from the temperature sensor 16, from the memory 46, and calculates the quantity of temperature compensation 80 based on the approximation curve (third approximation curve information 74) and the detected voltage 66. The CPU 44 outputs the quantity of temperature compensation 80 to the frequency correction circuit 42. In this way, the CPU 44 calculates the quantity of temperature compensation 80 and outputs the quantity of temperature compensation 80 to the frequency correction circuit 42 every predetermined time. Thus, the temperature-compensated oscillation signal 68 is outputted from the frequency correction circuit 42 every predetermined time.

The above embodiment is described on the assumption that when the elevated-temperature frequency temperature information 77a and the lowered-temperature frequency temperature information 77b includes temperature information at the time of frequency measuring that is different from each other, or when the temperature information that is necessary for the frequency temperature information 76 is different from the temperature information of the elevated-temperature frequency temperature information 77a and the lowered-temperature frequency temperature information 77b, the frequency temperature information 76 is generated using the plural pieces of approximation curve information expressed by Equation 1.

However, when the temperature information of the elevated-temperature frequency temperature information 77a and the temperature information of the lowered-temperature frequency temperature information 77b coincide with each other and also coincide with the temperature information required for the frequency temperature information 76, the PC 54 calculates information of an intermediate value of the frequencies by adding up and averaging the information of the frequencies corresponding to the same temperature information, of the elevated-temperature frequency temperature information 77a and the lowered-temperature frequency temperature information 77b. Thus, the PC 54 can generate the frequency temperature information 76 using a combination of the temperature information and the information of the intermediate value. In this case, the PC 54 need not calculate the first approximation curve information 70 and the second approximation curve information 72 and the process of manufacturing the piezoelectric oscillator 10 can be simplified. Therefore, the cost can be restrained.

In the embodiment, the frequency temperature information 76 is the information to take approximation of the temperature characteristic of the frequency of the piezoelectric vibrator 12 (or the oscillation circuit 14). However, the invention is not limited to this embodiment. For example, as information about the difference between a target frequency that should be outputted by the frequency correction circuit 42 and the frequency of the piezoelectric vibrator 12 (or the oscillation circuit 14), the information of the difference, or information acquired by adding the information of the target frequency to the information of the difference may be stored in the storage circuit 20 and the CPU 44 may calculate the quantity of temperature compensation 80 based on this information. In this case, the information stored in the storage circuit 20 includes the information of the difference between the target frequency and the frequency of the piezoelectric vibrator 12 (or the oscillation circuit 14), and information of temperature, or may be information of an approximation formula (temperature coefficients and offset coefficient) to take approximation of the difference between the target frequency and the frequency of the piezoelectric vibrator 12 (or the oscillation circuit 14). Thus, the calculation of the quantity of temperature compensation 80 by the CPU 44 can be simplified.

Figure 3A:
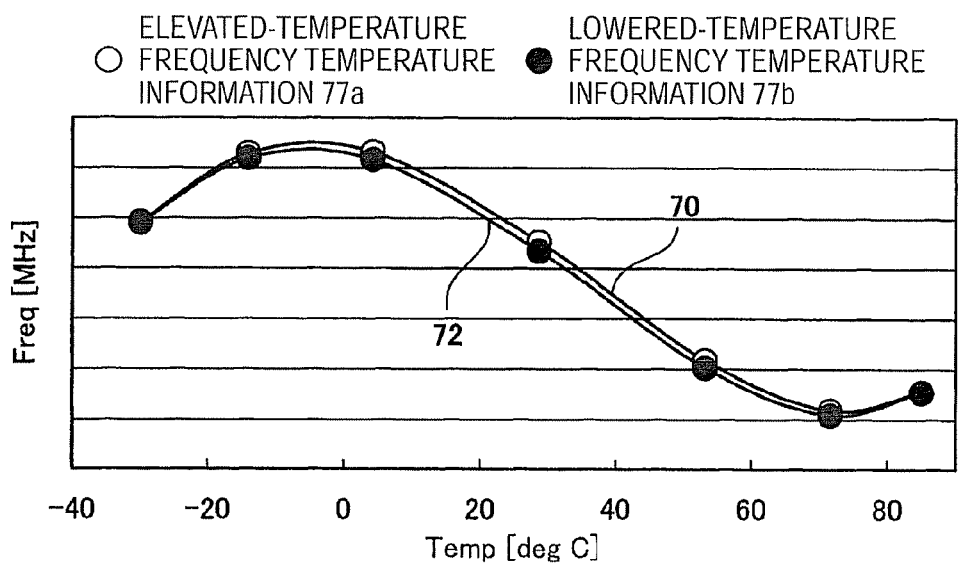
FIG. 3A and FIG. 3B show the hysteresis characteristic of an oscillation frequency of a piezoelectric vibrator according to the embodiment.
Figure 3B:
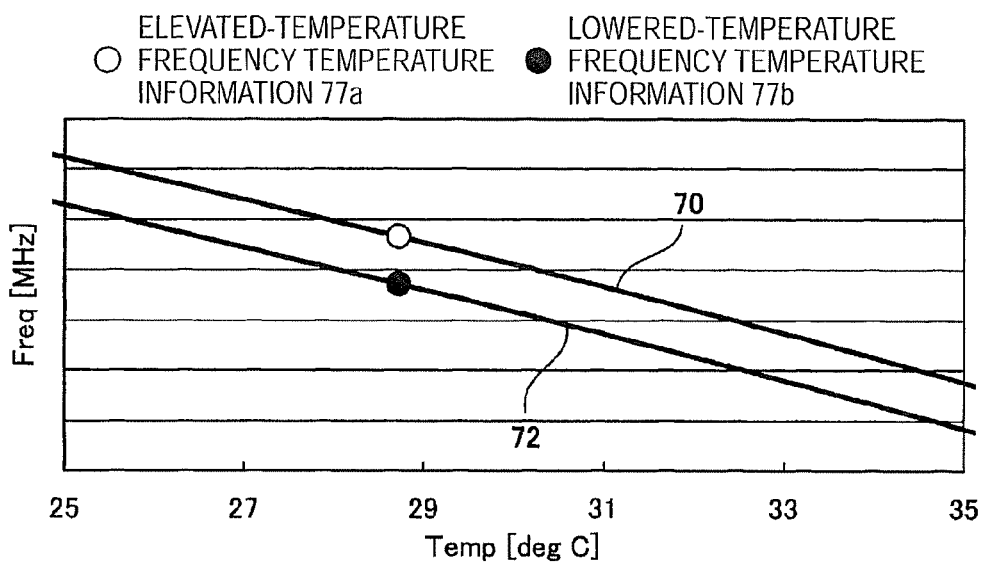
Figure 4A:
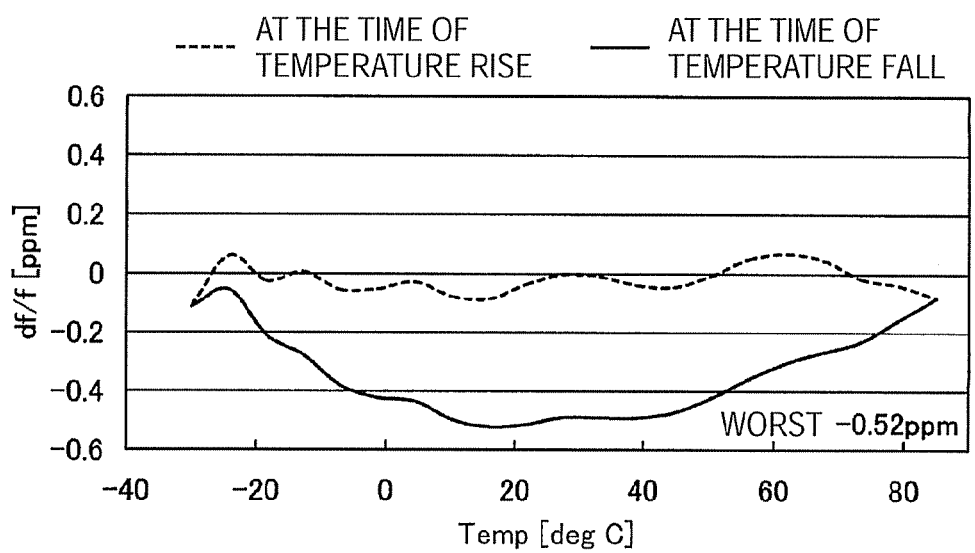
FIG. 4A and FIG. 4B show the frequency deviation in the case where temperature compensation is carried out using a temperature coefficient measured at the time of temperature rise and at the time of temperature fall.
Figure 4B:
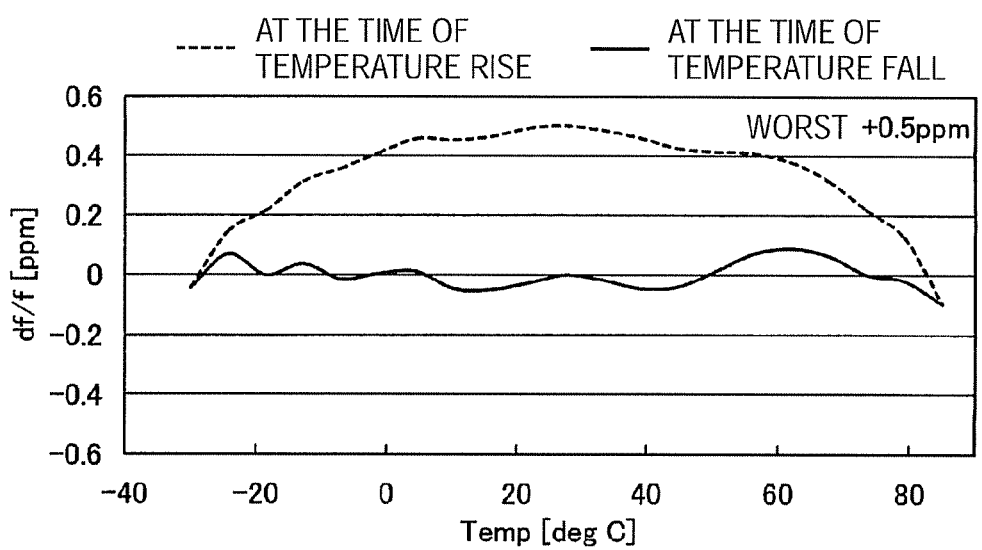

Next, the effects and advantages of the piezoelectric oscillator 10 according to the embodiment will be described. FIG. 3A shows the hysteresis characteristic of the piezoelectric vibrator. FIG. 3B shows a partially enlarged view of FIG. 3A. FIG. 4A shows the frequency deviation of the oscillation signal outputted from the temperature compensation circuit (at the time of temperature rise and at the time of temperature fall) in the case where temperature compensation is carried out using the elevated-temperature frequency temperature information in the case of temperature rise. FIG. 4B shows the frequency deviation of the oscillation signal outputted from the temperature compensation circuit (at the time of temperature rise and at the time of temperature fall) in the case where temperature compensation is carried out using the lowered-temperature frequency temperature information in the case of temperature fall. FIG. 5A shows the frequency temperature information according to the embodiment. FIG. 5B shows a partially enlarged view of FIG. 5A. FIG. 5C shows the frequency deviation of the oscillation signal outputted from the temperature compensation circuit in the case where temperature compensation is carried out using the frequency temperature information according to the embodiment.

As described with reference to the traditional technique, the piezoelectric vibrator does not have the same frequency temperature characteristic at the time of temperature rise and at the time of temperature fall and has a hysteresis characteristic, as shown in FIG. 3A and FIG. 3B. Thus, in the case where the temperature compensation circuit 40 calculates an approximation curve (first approximation curve information 70) using the elevated-temperature frequency temperature information 77a acquired at the time of temperature rise, as shown in FIG. 3A and FIG. 3B, and carries out temperature compensation based on the calculated approximation curve, the temperature compensation is carried out successfully when the temperature of the piezoelectric oscillator 10 is elevated, but the temperature compensation is not carried out successfully and the frequency deviation exceeds 0.5 ppm when the temperature is lowered, as shown in FIG. 4A.

In the case where the temperature compensation circuit 40 calculates an approximation curve (second approximation curve information 72) using the lowered-temperature frequency temperature information 77b acquired at the time of temperature fall, as shown in FIG. 3A and FIG. 3B, and carries out temperature compensation based on the calculated approximation curve, the temperature compensation is carried out successfully when the temperature of the piezoelectric vibrator 12 is lowered, but the temperature compensation is not carried out successfully and the frequency deviation is 0.5 ppm when the temperature is elevated, as shown in FIG. 4B. The occurrence of such frequency deviation in the device having the GPS function that is considered in this embodiment will adversely affect the positioning capability, as described with reference to the traditional technique.

Meanwhile, the frequency temperature information 76 in this embodiment is formed by being extracted from the third approximation curve information 74 that is calculated as the intermediate value in the direction of frequency between the first approximation curve information 70 calculated corresponding to the elevated-temperature frequency temperature information 77a and the second approximation curve information 72 calculated corresponding to the lowered-temperature frequency temperature information 77b, as shown in FIG. 5A and FIG. 5B. Thus, the temperature compensation circuit 40 calculates the frequency deviation from the reference frequency using the third approximation curve information 74 and the information of the ambient temperature (detected voltage 66) and calculates the quantity of temperature compensation 80 based on the calculated frequency deviation. Thus, whether the ambient temperature is elevated or lowered, a correction error due to the hysteresis characteristic of the piezoelectric vibrator 12 can be restrained within a predetermined range. In this embodiment, as shown in FIG. 5C, it can be seen that the frequency deviation can be restrained to approximately 0.3 ppm and successful temperature compensation can be carried out to the piezoelectric vibrator 12 having the hysteresis characteristic both at the time of temperature rise and at the time of temperature fall.

By the way, the hysteresis characteristic of the piezoelectric vibrator 12 according to the embodiment appears most conspicuously near the reference temperature and becomes less conspicuous as away from the reference temperature. The hysteresis characteristic is hardly detected at the lowest setting temperature (−30° C.) and the highest setting temperature (+85° C.). Therefore, by limiting the measuring range of one of the elevated-temperature frequency temperature information 77a and the lowered-temperature frequency temperature information 77b and then carrying out approximate calculation, it is possible to reduce the time required for constructing the frequency temperature information 76 according to the embodiment.

Figure 6A:
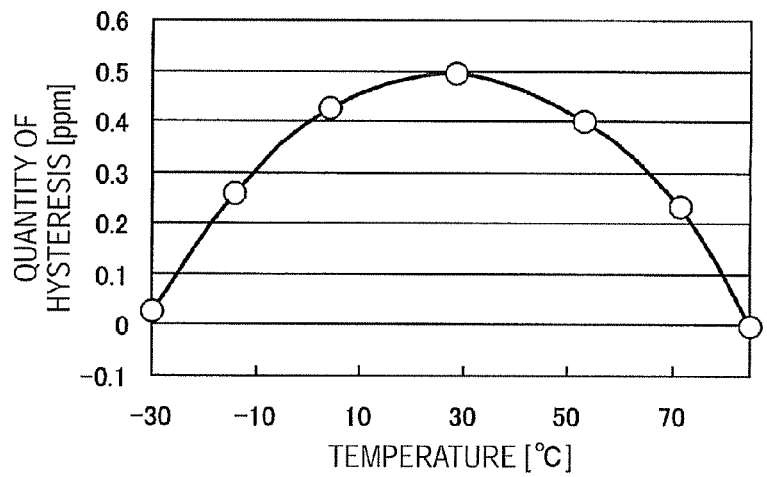
FIG. 6A to FIG. 6C show an approximation method for calculating lowered-temperature frequency temperature information according to the embodiment.
Figure 6B:
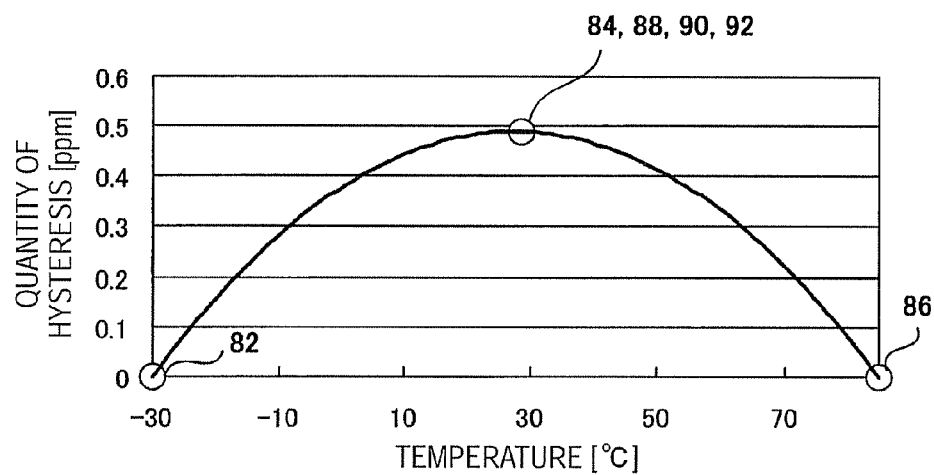
Figure 6C:
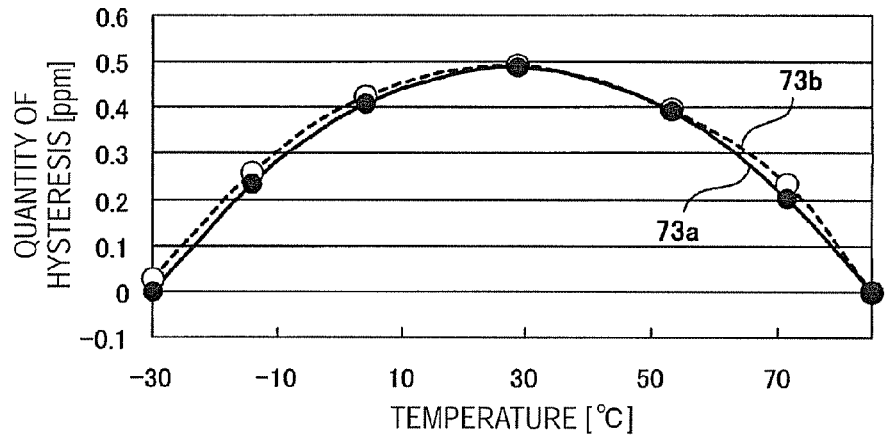

FIG. 6A to FIG. 6C show the difference between the frequency temperature information acquired at the time of temperature rise with respect to the oscillation frequency of the piezoelectric vibrator and the frequency temperature information acquired at the time of temperature fall (the quantity of hysteresis). As shown in FIG. 6A, it is found that the difference between the elevated-temperature frequency temperature information 77a acquired at the time of temperature rise of the oscillation frequency of the piezoelectric vibrator (first approximation curve information 70; see FIGS. 3A and 3B and the like) and the lowered-temperature frequency temperature information 77b acquired at the time of temperature fall (second approximation curve information 72; see FIGS. 3A and 3B and the like) has a quadratic function-like shape that is upwardly convex about the reference temperature. Thus, according to the invention, the overall hysteresis characteristic is calculated in a simple manner on the basis of the quantity of hysteresis shown at the reference temperature.

For example, the elevated-temperature frequency temperature information 77a is generated by combining the temperature information and the information of the frequency at every predetermined temperature in the case where the ambient temperature of the piezoelectric vibrator 12 is elevated across the reference temperature, as in the foregoing description. In this case, the elevated-temperature frequency temperature information 77a includes low-temperature zone information 82 (including the lowest setting temperature) measured in a lower temperature zone than the reference temperature, first reference temperature zone information 84 measured in a reference temperature zone including the reference temperature, and high-temperature zone information 86 (including the highest setting temperature) measured in a higher temperature zone than the reference temperature zone. Moreover, the first approximation curve information 70 corresponding to this elevated-temperature frequency temperature information 77a is calculated.

Second lowered-temperature frequency temperature information (not shown) that is approximately calculated can be calculated using the difference between second reference temperature zone information 88 measured in the reference temperature zone in the case where the ambient temperature is lowered across the reference temperature and the first reference temperature zone information 84, the low-temperature zone information 82, and the high-temperature zone information 86. Here, as the difference between the elevated-temperature frequency temperature information 77a and the lowered-temperature frequency temperature information 77b (quantity of hysteresis) in the high-temperature zone is approximated to zero, a quadratic temperature coefficient of a quadratic function that approximates the quantity of hysteresis from three plotted points can be calculated, as shown in FIG. 6B. As this quadratic temperature coefficient is subtracted from the quadratic temperature coefficient forming the first approximation curve information 70, second approximation curve information (not shown) can be calculated. Then, as temperature information for every predetermined temperature and the information of the frequency corresponding to the temperature information are extracted from the second approximation curve information (not shown), lowered-temperature frequency temperature information (not shown) can be generated approximately.

If two or more points are measured in the reference temperature zone and fitted by using corresponding power series and the resulting temperature coefficient is subtracted from the temperature coefficient forming the corresponding first approximation curve information 70, second approximation curve information (not shown) can be calculated. All the above arithmetic operation is carried out on the PC 54. As shown in FIG. 6C, it can be seen that the difference 73a between the elevated-temperature frequency temperature characteristic 77a and the approximately calculated lowered-temperature frequency temperature characteristic (not shown) has a hysteresis characteristic comparable to the difference 73b between the elevated-temperature frequency temperature characteristic 77a and the lowered-temperature frequency temperature characteristic 77b. In this embodiment, the second reference temperature zone information 88 may be generated first and the elevated-temperature frequency temperature information 77a may be generated after that.

On the other hand, in the case of using the above approximation in the calculation of the elevated-temperature frequency temperature information 77a, the lowered-temperature frequency temperature information 77b is generated by combining temperature information and information of the frequency for each predetermined temperature in the case where the ambient temperature of the piezoelectric vibrator 12 is lowered across the reference temperature, as in the foregoing description. In this case, the lowered-temperature frequency temperature information 77b includes high-temperature zone information (approximated as the same as the high-temperature zone information 86) measured in a higher temperature zone than the reference temperature in the case where the ambient temperature is elevated across the reference temperature, third reference temperature zone information 90 (the same as the second reference temperature zone information 88) measured in a reference temperature zone including the reference temperature, and low-temperature zone information (approximated as the same as the low-temperature zone information 82) measured in a lower temperature zone than the reference temperature zone. Then, the second approximation curve information 72 corresponding to this lowered-temperature frequency temperature information 77b is calculated.

Elevated-temperature frequency temperature information (not shown) that is approximately calculated can be calculated using the difference between fourth reference temperature zone information 92 (the same as the first reference temperature zone information 84) measured in the reference temperature zone in the case where the ambient temperature is elevated across the reference temperature and the third reference temperature zone information 90, the low-temperature zone information 82, and the high-temperature zone information 86. Here, as the difference between the elevated-temperature frequency temperature information 77a and the lowered-temperature frequency temperature information 77b (quantity of hysteresis) in the low-temperature zone and in the high-temperature zone is approximated to zero, a quadratic temperature coefficient of a quadratic function that approximates the quantity of hysteresis from three plotted points can be calculated, as shown in FIG. 6B. As this quadratic temperature coefficient is subtracted from the quadratic temperature coefficient forming the second approximation curve information 72, first approximation curve information (not shown) can be calculated. Then, as temperature information for every predetermined temperature and the information of the frequency corresponding to the temperature information are extracted from the first approximation curve information (not shown), elevated-temperature frequency temperature information (not shown) can be generated approximately.

FIG. 7 shows a table in which the volumes of frequency temperature information stored in the storage circuit are compared. As shown in FIG. 7, eleven digits are required when information of the absolute value of frequency is stored as frequency temperature information. However, when information of a frequency deviation from the reference frequency is stored, only five digits are required and therefore the volume of information of the frequency can be reduced by about 45%. If the volume is 100 in the case where the elevated-temperature frequency temperature information 77a and the lowered-temperature frequency temperature information 77b are configured using information of the absolute value of frequency, the volume can be reduced by 50% when the frequency temperature information 76 is configured using information of the absolute value of frequency, and the volume can be reduced by 73% when the frequency temperature information 76 is configured using information of the frequency deviation. As the number of digits that is necessary for the information of address stored as frequency temperature information, three digits (allowing up to eight addresses) suffice when temperature is measured at seven points. For the information of ambient temperature (detected voltage 66), the necessary number of digits is decided according to its resolution. Moreover, when the frequency temperature information is the information of temperature coefficient, the necessary number of digits is decided according to significant figures of the temperature coefficient. However, since the temperature information is not necessary, the volume can be reduced by that amount.

As described above, according to the temperature compensation method for the piezoelectric oscillator 10 and the piezoelectric oscillator 10 according to the embodiment, first, the frequency temperature information 76 as the intermediate value between the elevated-temperature frequency temperature information 77a generated when the ambient temperature of the piezoelectric vibrator 12 is elevated and the lowered-temperature frequency temperature information 77b generated when the ambient temperature is lowered is inputted. The frequency deviation from the reference frequency is calculated using the frequency temperature information 76 and the temperature information of the piezoelectric vibrator 12 at the time of oscillation of the piezoelectric vibrator 12. The quantity of temperature compensation 80 is thus calculated. Therefore, whether the ambient temperature is elevated or lowered, a correction error due to the hysteresis characteristic of the piezoelectric vibrator can be restrained within a predetermined range. Moreover, since the elevated-temperature frequency temperature information 77a and the lowered-temperature frequency temperature information 77b or the temperature coefficients extracted from these pieces of information need not be stored in the storage circuit 20, increase in the capacity load of the storage circuit 20 can be avoided.

Secondly, the frequency temperature information 76 is extracted from the third approximation curve information 74 calculated as the intermediate value between the first approximation curve information 70 calculated on the basis of the elevated-temperature frequency temperature information 77a and showing a continuous temperature characteristic of the oscillation frequency and the second approximation curve information 72 calculated on the basis of the lowered-temperature frequency temperature information 77b and showing a continuous temperature characteristic of the oscillation frequency. Thus, the frequency temperature information 76 is extracted from the third approximation curve information 74 that changes continuously in relation to temperature change. Meanwhile, the temperature compensation circuit 40 forms an approximation curve of the oscillation frequency that changes continuously in relation to temperature change, on the basis of the frequency temperature information 76. Therefore, since the approximation curve calculated by the temperature compensation circuit 40 is the third approximation curve information 74, highly accurate temperature compensation can be carried out. Moreover, since the elevated-temperature frequency temperature information 77a and the lowered-temperature frequency temperature information 77b need not be measured at the same temperature position, the yield of generation of the frequency temperature information 76 can be enhanced and the cost can be restrained.

Thirdly, as the frequency temperature information 76 is generated on the basis of temperature information and information of the oscillation frequency corresponding to the temperature information or information of the frequency deviation from the reference frequency corresponding to the temperature information, the calculation of the temperature coefficients is not necessary on the side of the piezoelectric oscillator 10. Therefore, workload at the time of forming the piezoelectric oscillator 10 can be restrained and the cost can be restrained. Particularly in the case of storing the information of the frequency deviation, the number of digits is reduced and therefore the volume of data can be reduced. Thus, the storage circuit 20 can be miniaturized and the cost can be restrained. In this case, temperature coefficients of a power series that overlap the plotting of the frequency temperature information 76 is calculated and the third approximation curve information 74 is calculated on the user side. Accurate temperature coefficients can be calculated independently on the user side.

Fourthly, as the frequency temperature information 76 is generated on the basis of the temperature coefficients extracted from the third approximation curve information 74, the temperature compensation circuit 40 needs no arithmetic operation to calculate the third approximation curve information 74. Therefore, a system equipped with the piezoelectric oscillator 10 can be easily constructed with reduced burden on the user side.

Fifthly, the elevated-temperature frequency temperature information 77a is approximately calculated using the lowered-temperature frequency temperature information 77b and information of temperature and frequency measured when the ambient temperature of the piezoelectric vibrator 12 is elevated to the reference temperature zone. If the difference between the frequency component of the elevated-temperature frequency temperature information 77a and the frequency component of the lowered-temperature frequency temperature information 77b is considered, the difference reaches its maximum in the reference temperature zone and decreases as away from the reference temperature. Therefore, the elevated-temperature frequency temperature information 77a can be approximately calculated using the lowered-temperature frequency temperature information 77b and information of temperature and frequency measured when the ambient temperature is elevated to the reference temperature zone. Thus, it suffices to acquire the information of the temperature and frequency in the case of temperature rise, only in the reference temperature zone, and the process of elevating temperature to a higher temperature zone than the reference temperature is not necessary. Thus, since the acquisition time for the elevated-temperature frequency temperature information 77a can be reduced, workload can be reduced and the cost can be restrained.

Sixthly, the lowered-temperature frequency temperature information 77b is approximately calculated using the elevated-temperature frequency temperature information 77a and information of temperature and frequency measured when the ambient temperature of the piezoelectric vibrator 12 is lowered to the reference temperature zone. For the similar reason to the above, lowered-temperature frequency temperature information 77b can be approximately calculated using the elevated-temperature frequency temperature information 77a and information of temperature and frequency measured when the ambient temperature is lowered to the reference temperature zone. Moreover, it suffices to measure the reference temperature zone at the time of temperature fall and it is not necessary to measure a lower temperature zone than the reference temperature. Thus, since the acquisition time for the lowered-temperature frequency temperature information 77b can be reduced, workload can be reduced and the cost can be restrained.

Seventhly, the temperature sensor 16 which outputs the detected voltage 66 corresponding to the ambient temperature is arranged near the piezoelectric vibrator 12. The elevated-temperature frequency temperature information 77a and the lowered-temperature frequency temperature information 77b are generated as functions of the detected voltage 66. The frequency temperature information 76 is calculated on the basis of the elevated-temperature frequency temperature information 77a and the lowered-temperature frequency temperature information 77b. The oscillation signal 58 is outputted to the temperature compensation circuit capable of calculating the quantity of temperature compensation 80 based on the frequency temperature information 76 and the detected voltage 66. The detected voltage 66 is outputted to the temperature compensation circuit 40 from the temperature sensor 16.

Thus, the temperature sensor 16 can measure the ambient temperature of the piezoelectric vibrator 12 while restraining measuring errors. Therefore, the elevated-temperature frequency temperature information 77a and the lowered-temperature frequency temperature information 77b can be generated highly accurately and the frequency temperature information 76 can be calculated highly accurately. Moreover, since the temperature information of the piezoelectric vibrator 12 can be measured in real time and highly accurately, correction errors in the temperature compensation circuit 40 can be restrained and highly accurate temperature compensation can be carried out.

The embodiment is described on the assumption that a thickness-shear vibrator is used as the piezoelectric vibrator. However, the vibrator is not limited to this example and may be a double-ended tuning fork piezoelectric vibrator, single-beam piezoelectric vibrator, SAW resonator or the like. The elevated-temperature frequency temperature information 77a, the lowered-temperature frequency temperature information 77b, the first approximation curve information 70, the second approximation curve information 72, the third approximation curve information 74 and the frequency temperature information 76 are generated as functions of the detected voltage 66. However, the detected voltage 66 outputted from the temperature sensor 16 may be converted to the value of the actual temperature and thus used. Accordingly, these pieces of information may be generated as function of the actual temperature. Moreover, the PC 54 and CPU 44 may be configured to be able to recognize the above information as functions of temperature.

The entire disclosure of Japanese Patent Application No. 2009-266693, filed Nov. 24, 2009 is expressly incorporated by reference herein.

What is claimed is:

1. A temperature compensation method for a piezoelectric oscillator including
   a piezoelectric vibrator having a frequency temperature characteristic with a hysteresis characteristic, and
   an oscillation circuit which oscillates the piezoelectric vibrator and outputs an oscillation signal,
   wherein, to a temperature compensation circuit which can calculate a quantity of temperature compensation using frequency temperature information indicating a temperature characteristic of an oscillation frequency of the piezoelectric vibrator and temperature information of the piezoelectric vibrator at the time of oscillation of the oscillation signal, the oscillation signal and the frequency temperature information are outputted,
   the method comprising:
   calculating, as the frequency temperature information, an intermediate value between
   elevated-temperature frequency temperature information of the piezoelectric vibrator that is generated in the case where ambient temperature of the piezoelectric vibrator is elevated, and
   lowered-temperature frequency temperature information of the piezoelectric vibrator that is generated in the case where the ambient temperature is lowered.

2. The temperature compensation method for the piezoelectric oscillator according to claim 1, wherein the frequency temperature information is extracted from
third approximation curve information that is calculated as an intermediate value between
first approximation curve information calculated on the basis of the elevated-temperature frequency temperature information and representing a continuous temperature characteristic of the oscillation frequency, and
second approximation curve information calculated on the basis of the lowered-temperature frequency temperature information and representing a continuous temperature characteristic of the oscillation frequency.

3. The temperature compensation method for the piezoelectric oscillator according to claim 1, wherein the frequency temperature information is generated on the basis of temperature information, information of an oscillation frequency corresponding to the temperature information, or information of a frequency deviation from a reference frequency corresponding to the temperature information.

4. The temperature compensation method for the piezoelectric oscillator according to claim 2, wherein the frequency temperature information is generated on the basis of information of a temperature coefficient extracted from the third approximation curve information.

5. The temperature compensation method for the piezoelectric oscillator according to claim 1, wherein the elevated-temperature frequency temperature information is calculated approximately by using the lowered-temperature frequency temperature information and information of temperature and frequency measured where the ambient temperature is elevated to a reference temperature zone.

6. The temperature compensation method for the piezoelectric oscillator according to claim 1, wherein the lowered-temperature frequency temperature information is calculated approximately by using the elevated-temperature frequency temperature information and information of temperature and frequency measured where the ambient temperature is lowered to a reference temperature zone.

7. The temperature compensation method for the piezoelectric oscillator according to claim 1, wherein a temperature detection unit which outputs a detected voltage corresponding to the ambient temperature is arranged near the piezoelectric vibrator,
the elevated-temperature frequency temperature information and the lowered-temperature frequency temperature information are generated as functions of the detected voltage,
the frequency temperature information is calculated on the basis of the elevated-temperature frequency temperature information and the lowered-temperature frequency temperature information,
the oscillation signal is outputted to a temperature compensation circuit which can calculate a quantity of temperature compensation based on the frequency temperature information and the detected voltage, and
the detected voltage is outputted to the temperature compensation circuit from the temperature detection unit.

8. A piezoelectric oscillator comprising:
a piezoelectric vibrator having a frequency temperature characteristic with a hysteresis characteristic,
an oscillation circuit which oscillates the piezoelectric vibrator and outputs an oscillation signal, and
a storage circuit,
wherein, in the storage circuit, frequency temperature information is stored which shows a frequency temperature characteristic in a zone surrounded by two frequency temperature characteristics of the oscillation signal appearing in response to the influence of the hysteresis characteristic.

9. The piezoelectric oscillator according to claim 8, wherein the frequency temperature information is generated on the basis of temperature information, information of an oscillation frequency corresponding to the temperature information, or information of a frequency deviation from a reference frequency corresponding to the temperature information.

10. The piezoelectric oscillator according to claim 8, wherein the frequency temperature information is a temperature coefficient extracted from approximation curve information with a power series corresponding to the frequency temperature characteristic.

11. The piezoelectric oscillator according to claim 8, wherein a temperature detection unit which outputs a detected voltage corresponding to the ambient temperature is provided near the piezoelectric vibrator, and
the frequency temperature information
is calculated on the basis of the elevated-temperature frequency temperature information and the lowered-temperature frequency temperature information expressed as functions of the detected voltage and is stored in the storage circuit, the oscillation circuit
outputs an oscillation signal to a temperature compensation circuit which calculates a quantity of temperature compensation using the frequency temperature information and the detected voltage, and
the temperature detection unit
outputs the detected voltage to the temperature compensation circuit.

* * * * *